United States Patent
Nagorny

(10) Patent No.: US 10,297,457 B2
(45) Date of Patent: May 21, 2019

(54) CONTROLLING AZIMUTHAL UNIFORMITY OF ETCH PROCESS IN PLASMA PROCESSING CHAMBER

(71) Applicant: Mattson Technology, Inc., Fremont, CA (US)

(72) Inventor: Vladimir Nagorny, Tracy, CA (US)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 15/073,048

(22) Filed: Mar. 17, 2016

(65) Prior Publication Data

US 2016/0276230 A1   Sep. 22, 2016

Related U.S. Application Data

(60) Provisional application No. 62/135,437, filed on Mar. 19, 2015.

(51) Int. Cl.
   *C23C 16/00*    (2006.01)
   *H01L 21/306*   (2006.01)
   (Continued)

(52) U.S. Cl.
   CPC ........ *H01L 21/3065* (2013.01); *H01J 37/321* (2013.01); *H01J 37/3211* (2013.01); *H01J 37/32174* (2013.01); *H01J 37/32651* (2013.01)

(58) Field of Classification Search
   CPC ............... H01J 37/321; H01J 37/32119; H01J 37/32146; H01J 37/32155;
   (Continued)

(56) References Cited

U.S. PATENT DOCUMENTS 5,433,812 A * 7/1995 Cuomo .................. H05H 1/46
                                              118/723 I
5,571,366 A * 11/1996 Ishii .................. H01J 37/32082
                                              118/723 I
(Continued)

FOREIGN PATENT DOCUMENTS

JP      2011119659    6/2011
WO   WO 2004/010457   1/2004

OTHER PUBLICATIONS

PCT International Search Report for corresponding PCT Application No. PCT/US2016/022906, dated Jul. 29, 2016—5 pages.

*Primary Examiner* — Luz L Alejandro Mulero
(74) *Attorney, Agent, or Firm* — Dority & Manning, P.A.

(57) ABSTRACT

Apparatus, systems, and methods for controlling azimuthal uniformity of an etch process in a plasma processing chamber are provided. In one embodiment, a plasma processing apparatus can include a plasma processing chamber and an RF cage disposed above the plasma processing chamber. A dielectric window can separate the plasma processing chamber and the RF cage. The apparatus can include a plasma generating coil disposed above the dielectric window. The plasma generating coil can be operable to generate an inductively coupled plasma in the plasma processing chamber when energized. The apparatus further includes a conductive surface disposed within the RF cage proximate to at least a portion of the plasma generating coil. The conductive surface is arranged to generate an azimuthally variable inductive coupling between the conductive surface and the plasma generating coil when the plasma generating coil is energized.

13 Claims, 9 Drawing Sheets

(51) Int. Cl.
*H01L 21/3065* (2006.01)
*H01J 37/32* (2006.01)

(58) Field of Classification Search
CPC ........... H01J 37/32165; H01J 37/32174; H01J 37/32183; H01J 37/32623; H01J 37/32633; H01J 37/32642; H01J 37/32651; H01J 37/3211; H01J 37/32128; H01J 37/32137
USPC ...... 118/723 I, 723 IR, 723 AN; 156/345.48, 156/345.49; 315/111.51
See application file for complete search history.

(56) References Cited

U.S. PATENT DOCUMENTS

| | | |
|---|---|---|
| 5,897,712 A * | 4/1999 | Hanawa ................ H01J 37/321 |
| | | 118/723 I |
| 6,267,074 B1 | 7/2001 | Okumura |
| 6,463,875 B1 | 10/2002 | Chen et al. |
| 6,507,155 B1 | 1/2003 | Barnes et al. |
| 6,551,447 B1 | 4/2003 | Savas et al. |
| 7,232,767 B2 | 6/2007 | George et al. |
| 2001/0022157 A1* | 9/2001 | Shin ...................... H01J 37/321 |
| | | 118/723 I |
| 2002/0041160 A1* | 4/2002 | Barnes .................. H01J 37/321 |
| | | 315/111.21 |
| 2002/0185229 A1 | 12/2002 | Brcka et al. |
| 2005/0194099 A1 | 9/2005 | Jewett et al. |
| 2007/0170867 A1 | 7/2007 | Persing et al. |
| 2007/0181257 A1 | 8/2007 | Comendant et al. |
| 2009/0159425 A1 | 6/2009 | Liu et al. |
| 2010/0136262 A1 | 6/2010 | Godyak |
| 2010/0269980 A1* | 10/2010 | Nishimura ............ H01J 37/321 |
| | | 156/345.48 |
| 2011/0048644 A1* | 3/2011 | Collins ................. H01J 37/321 |
| | | 156/345.48 |
| 2011/0094682 A1 | 4/2011 | Yamazawa et al. |
| 2012/0152901 A1 | 6/2012 | Nagorny et al. |
| 2012/0208371 A1 | 8/2012 | Rogers et al. |

* cited by examiner

CONTROLLING AZIMUTHAL UNIFORMITY OF ETCH PROCESS IN PLASMA PROCESSING CHAMBER

PRIORITY CLAIM

This application claims the benefit of priority of U.S. Provisional Patent Application Ser. No. 62/135,437, which is incorporated herein by reference for all purposes.

FIELD

The present disclosure relates to processing a substrate using a plasma source.

BACKGROUND

Plasma processing is widely used in the semiconductor industry for deposition, etching, resist removal, and related processing of semiconductor wafers and other substrates. Plasma sources (e.g., microwave, ECR, inductive, etc.) are often used for plasma processing to produce high density plasma and reactive species for processing substrates. RF plasma sources can be used in modern plasma etch applications because of the ability of the RF plasma source to generate a process chemistry out of feed gases, and to provide an isotropic or highly anisotropic etch at high or low etch rates. Plasma processing tools can be able to sustain a stable plasma in very different gases and under very different conditions (gas flow, gas pressure, etc.) and can provide for independent control of plasma density, plasma profile and ion energy.

Requirements for process equivalence across, for instance, an entire semiconductor wafer, from wafer to wafer in an etch chamber (and/or etch head), from etch chamber to etch chamber across a tool, from etch tool to etch tool across a fabrication facility, or for every fabrication facility across the world can lead to strict requirements for plasma process uniformity in the processing of semiconductor wafers and other substrates. As a result, many plasma processing tools have process controls to compensate for non-uniformities in gas flow, plasma density, and other plasma process parameters. To meet stringent processing requirements for radial process uniformity, some manufacturers employ a variety of methods and systems, such as multiple-coil inductively couple plasma (ICP) sources or multi-zone capacitively coupled plasma (CCP) sources for plasma radial profile control, electrostatic chucks with multiple radial temperature zones, multiple gas injections, etc.

To achieve uniformity in azimuthal direction, some manufacturers design and build plasma chambers, plasma generating parts (e.g., coils, electrodes), electrostatic chucks (ESCs), gas injections and gas exhausts, focus rings, and other components as symmetric as possible to match the symmetry of the semiconductor wafer or other substrate. For this reason, some powered elements (e.g., capacitors) are screened from the antenna and the plasma by placing them outside of the main RF cage in additional enclosures. Wafer placement is also controlled with high precision. Moreover, the magnetic field of the Earth can also affect azimuthal uniformity depending on the location of the tool. For instance, in some cases, the magnetic field of the Earth can affect azimuthal process uniformity for different tools in the same room if the tools face different directions. Some manufacturers wrap champers with magnetic shields to reduce these effects.

In many cases, higher uniformity requirements lead to higher costs of the plasma processing tool. For example, a 1% non-uniformity requirement can require much more design efforts, additional controlling elements, more precise manufacturing of the parts and their assembly, etc. than a 3% non-uniformity requirement. However, imperfection can occur in the design, manufacturing and/or assembly of the process tools. Imperfections in the design can lead to systematic non-uniformities. Imperfections in a manufactured part can lead to both systematic and random (e.g., one tool to another) non-uniformities. Imperfections in assembly can lead to random non-uniformities. When a tool is assembled and all parts are placed in their positions, these non-uniformities are combined together and in the worst case they add to each other rather than compensate each other.

Most of the resulting radial non-uniformity can be compensated by tuning the process using available control "knobs" (powers, temperatures of ESC zones, process time, etc.), but there is no control "knob" for tuning the process in azimuthal direction. So if azimuthal non-uniformity or azimuthal head-to-head mismatch exceeds an acceptable limit, then the only way to fix it, is to identify and replace parts with the largest contribution to azimuthal non-uniformity This procedure can be expensive and time consuming, leading to increased final production cost and increased price of the tool. In some cases, the parts that are replaced may not be bad parts at all and in combination with different other parts the overall non-uniformity of the tool could be below that limit.

The number of elements in and around a plasma processing chamber affecting plasma and process uniformity is quite large. These parts can include, for instance, a gas injection and gas outlet, coils, a pedestal with bias electrode, and an electrostatic chuck (ESC), an RF cage, chamber walls and the door for wafer transfer, ESC feed structure, magnetic field from earth and from elements of the structure—frame, screws, turbo pump, cooling fans, and other elements. Contribution to asymmetry from some of these parts can be made very small. However components such as ESC and coils cannot be made absolutely symmetric. For instance, the ESC can have a complicated structure with a number of electrodes, heating elements and cooling channels, bonding between different layers, etc. Coils can have leads and transitions from one turn to another. One may decrease the magnitude of non-uniformity associated with coil leads, by increasing number of leads and spreading the leads around (e.g., 3 one-turn coils oriented 120 degrees relative to each other instead of one 3 turn coil, or two 1.5 turn coils having leads on the opposite sides, etc.). However, this may lead to additional costs and may not provide for improved azimuthal uniformity.

One approach for addressing azimuthal non-uniformity is to provide for the tilting of the coil as a whole, with respect to the wafer (and/or the pedestal). However, this solution may not be practical because it can cause a very strong effect and cannot be used for fine tuning when the azimuthal non-uniformity is already small.

SUMMARY

Aspects and advantages of embodiments of the present disclosure will be set forth in part in the following description, or may be learned from the description, or may be learned through practice of the embodiments.

One example aspect of the present disclosure is directed to a plasma processing apparatus. The plasma processing apparatus can include a plasma processing chamber, an RF cage disposed above the plasma processing chamber, and dielectric window separating the plasma processing chamber and the RF cage. The plasma processing apparatus can further include a plasma generating coil disposed above the dielectric window. The plasma generating coil can be operable to generate an inductively coupled plasma in the plasma processing chamber when energized. The plasma processing apparatus can include a conductive surface disposed within the RF cage proximate to at least a portion of the plasma generating coil. The conductive surface can be so disposed as to generate an azimuthally variable inductive coupling between the conductive surface and the plasma generating coil when the plasma generating coil is energized.

Another example embodiment of the present disclosure is directed to a method for adjusting azimuthal process uniformity in a plasma processing apparatus. The method can include processing a semiconductor substrate in a plasma processing apparatus using a plasma etch process. The plasma processing apparatus can include a plasma processing chamber, an RF cage disposed above the plasma processing chamber, a dielectric window separating the plasma processing chamber and the RF cage, and a plasma generating coil disposed above the dielectric window. The method can further include analyzing data associated with an azimuthal profile associated with the plasma etch process. The method can include adjusting a conductive surface disposed within the RF cage proximate to at least a portion of the plasma generating coil to generate an azimuthally variable inductive coupling between the conductive surface and the plasma generating coil.

Yet another example embodiment of the present disclosure is directed to a plasma processing apparatus. The plasma processing apparatus can include a plasma processing chamber having an interior operable to confine a process gas, an RF cage disposed above the plasma processing chamber, and a dielectric window. The plasma processing apparatus can further include one or more inductive elements operable to generate an inductively coupled plasma in the plasma processing chamber when energized with RF energy. The plasma processing apparatus can include one or more conductive surfaces disposed within the RF cage proximate to at least a portion of the one or more inductive elements. At least a portion of the one or more conductive surfaces can be movable relative to the one or more inductive elements so as to generate one or more azimuthally variable inductive couplings between the one or more conductive surfaces and the one or more inductive elements when the one or more inductive elements are energized with RF energy.

Other example aspects of the present disclosure are directed to systems, methods, devices, and processes for controlling azimuthal uniformity in a plasma etch process.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
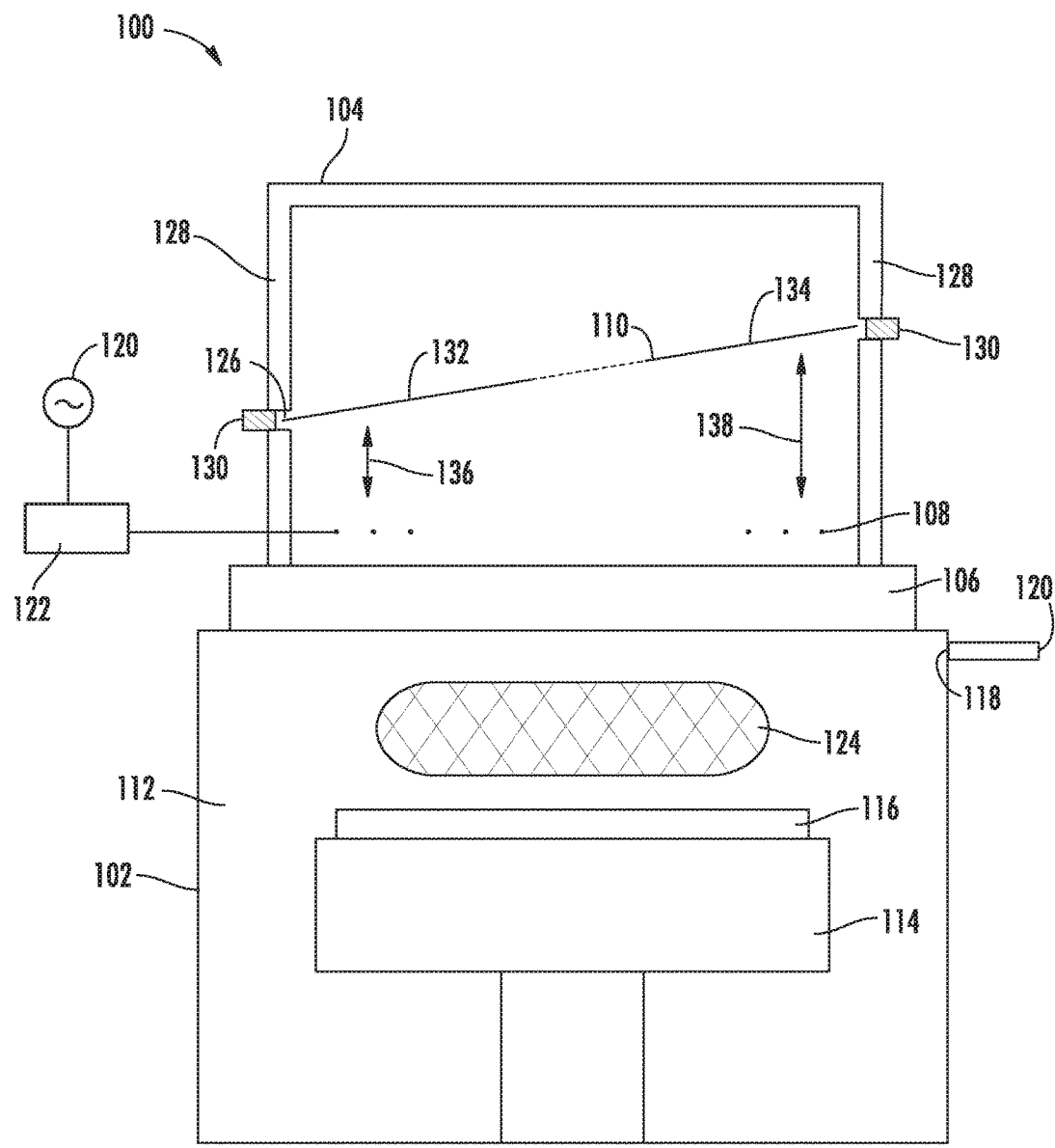
FIG. 1 depicts aspects of an example plasma processing apparatus according to example embodiments of the present disclosure.

A key requirement for any control is a predictable, monotonic response and not over-sensitivity of the output to the variation of the input. That means predictability and repeatability. For example, if the etch rate dependence on the bias power was too strong, then process results would not be repeatable—any small fluctuation of bias power would change the rate, making bias difficult to use.

The common difficulty with controlling azimuthal non-uniformity is that all parts are symmetric by design, but typically asymmetric elements affect azimuthal profile. According to example aspects of the present disclosure, a new element can be introduced that can easily be changed from symmetric to a controlled asymmetric, so that if corrective action is required, one can easily make a desired change in this element.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

To be more specific, example aspects of the present disclosure are directed to a conductive surface/RF shield disposed above the coil of a plasma process chamber at some distance from the coil, separating the coil from all other elements in the RF cage (e.g., capacitors, etc.). The coil can be an antenna, which "communicates" not only with the plasma, but with everything else proximate to the coil. Placing the shield and separating the coil from all other elements in the RF cage can cut off all undesirable "communications" between the coil and those elements and replace those communications with a single "communication" to the shield. In some implementations, grounding of this shield can be beneficial since it can remove stray capacitive and/or other coupling that the coil and/or the plasma might have with other elements inside the RF cage.

If the shield is placed in such a way that the coil is only slightly coupled (e.g., inductively) to the shield compared to a strong coupling to the plasma, then the power that the shield takes from the coil can be small and the effect of the shield on the process can be small. Controlling the distance between different parts of the coil and the shield can generate a small asymmetric, disturbance to the coupling between the coil and the plasma, and to the process, which depends on this coupling.

Example aspects of the present disclosure are directed to apparatus, systems, and methods for controlling azimuthal uniformity of etch processes in plasma processing chambers. As indicated herein, the adjustment of the distance between the conductive surface and different azimuthal portions of the coil can provide an effective control parameter for control of azimuthal process uniformity. For instance, in one embodiment, the conductive surface can include a ring shaped shield. Bending or tilting the shield toward the coil in a particular azimuthal area can reduce coil-to-plasma power transfer in that azimuthal area. Bending or tilting the shield away from the coil in a particular azimuthal area can reduce coil-to-shield coupling, and thus improve coil-to-plasma power transfer in that azimuthal area.

Since the power coupled to the shield is small, the correction to the plasma process due to this action can also be small. For instance, without being bound by any particular theory of operation, when one side of the shield gets closer to or farther from the coil, it affects the current in the coil everywhere. In other words it has no azimuthal effect on the current in the coil. However, the current induced in the shield by the coil flows at different distance from plasma, and affects differently the field in plasma. This effect is secondary. As a result, the second order effect it generates in plasma is also small, which makes it useful for control. Not bending or tilting the shield will generate a small, but uniform reduction of power transfer from the coil to the plasma. Thus, the result of this action can be predictable, monotonic and small and hence this kind of azimuthal process control can satisfy such requirements.

This process for controlling azimuthal uniformity can be especially effective in circumstances when neither design nor parts manufacturing or tool assembly generate systematic azimuthal non-uniformity, but rather the final non-uniformity is caused by a number of random factors and is difficult to predict. In these circumstances, every processing chamber may need individual correction, and the required correction may be small.

Controlling azimuthal uniformity according to example embodiments of the present disclosure can reduce azimuthal non-uniformity of the process result on the semiconductor wafer or other substrate, for instance from about 1.5% to less than about 0.5%, and quickly one head to another using simple procedure. As used herein, the use of the term "about" when used in conjunction with a numerical value refers to within about 35% of the stated amount. In some implementations, example aspects of of the present disclosure can be used to reduce azimuthal non-uniformity from about 1.5% to approximately 0.2-0.5%, and to quickly match processing heads and chambers using simple procedures. Some processes can lead to heads with the same azimuthal uniformity.

Moreover, the process of reducing azimuthal non-uniformity according to example aspects of the present disclosure can be relatively straightforward. First, after processing semiconductor wafers and achieving a desired radial profile, the azimuthal profile can be analyzed to identify maximums and minimums. In many cases the maximums and minimums can be identified near the edge of the plasma processing profile, where maximums and minimums are more pronounced. The distance of an RF shield relative to the coil can then be adjusted to change the azimuthal profile of the process. For instance, an edge of the shield can be lifted up away from a coil at azimuthal locations where ICP power to plasma needs to be increased. An edge of the shield can be moved down closer to the coil at azimuthal locations where ICP power to plasma needs to be decreased. It can take just one or two iterations to achieve a desired uniformity/profile.

Adjusting the distance of an edge of an RF shield relative to a coil can provide flexibility in addressing both random and systematic azimuthal non-uniformities. Other methods for adjusting the distance of a conductive surface relative to a coil to address azimuthal non-uniformities can be used without deviating from the scope of the present disclosure. For instance, in some embodiments, partial shields disposed proximate to only a select azimuthal portion of the coil can be used to address more systematic azimuthal non-uniformities. In some embodiments, if a plasma source has a plurality of coils, then a plurality of shields can be disposed relative to the plurality of coils to address azimuthal non-uniformities. In some embodiments, instead of bending down, the shield may include a flexible section (e.g., a wire) attached to the shield. The flexible section can slack down toward the coil creating an effect similar to bending down the shield.

With reference now to the Figures, example embodiments of the present disclosure will now be discussed in detail. FIG. 1 depicts aspects of an example plasma processing apparatus 100 according to example embodiments of the present disclosure. FIG. 1 illustrates cross-sectional view of the plasma processing apparatus 100. The plasma processing apparatus 100 can include a plasma processing chamber 102, an RF cage 104, a dielectric window 106, an inductive element 108, and a conductive surface or shield 110.

The processing chamber 102 can define an interior space 112. A pedestal or substrate holder 114 can be used to support a substrate 116, such as a semiconductor wafer, within the interior space 112. In some implementations, feed gas can be introduced into the processing chamber 102 through one or more feed gas hole(s) 118 in a wall. The feed gas hole(s) 118 can receive process gas through tubulations such as, for example, one or more feed gas conduit(s) 120. The location and orientation of feed gas hole(s) 118 and/or feed gas conduit(s) 120 shown in FIG. 1 are not intended to be limiting. The plasma processing apparatus 100 can be configured to include feed gas hole(s) 118 and/or feed gas conduit(s) 120 in other locations and orientations (e.g., dielectric window 106) and still properly provide feed gas to plasma processing apparatus 100. For instance, in some implementations, feed gas can be provided via feed gas hole(s) in the dielectric window or through a showerhead.

Each of the feed gas conduit(s) 120 and/or feed hole(s) 118 can be configured to admit a preselected flow rate of feed gas to interior space 112. These flow rates can be adjusted based on desired processing parameters. For instance, the control of various flow rates of feed gas from different feed gas conduit(s) into interior space 112 can provide for the efficient and separate tuning of the spatial distribution of charged and neutral species generated in the process gas during plasma processing.

The RF cage 104 can be disposed above the plasma processing chamber 102. The RF cage 104 can be formed by conductive material or by a mesh of such material and can be grounded to reduce the radiation of electromagnetic interference into the surrounding environment, as well as shield its interior (and/or the component enclosed therein) from external electromagnetic radiation. For example, the RF cage 104 can be configured to enclose the inductive element 108, as well as the conductive surface 110. Placing the conductive surface 110 and the inductive element 108 in the RF cage 104 can reduce undesirable interference between the inductive element 108 and other elements placed above the conductive surface 110 in the RF cage 104, thereby further facilitating inductive coupling between the inductive element 108 and the conductive surface 110 when the inductive element 108 is energized.

In some implementations, the dielectric window 106 can separate the plasma processing chamber 102 and the RF cage 104. For instance, the dielectric window 106 can be located above the substrate holder 114. The dielectric window 106 can be a window positioned near the inductive element 108, through which a substantial portion of the magnetic flux lines from the inductive element 108 enter and/or return from the plasma processing chamber 102. The dielectric window 106 can include materials such as quartz, ceramic, etc. It will be understood that the dielectric window 106 can be configured in various different ways. For example, as shown in FIG. 1, the dielectric window 106 can span an entire upper surface of a chamber and be supported by mechanical bonding.

The inductive element 108 can be disposed above the dielectric window 106. For instance, the inductive element 108 can include a plasma generating coil (and/or an antenna element) that when supplied with RF power, induces a plasma in the process gas in the interior space 120 of the plasma processing apparatus 100. For instance, an RF generator 120 can be configured to provide electromagnetic energy through a matching network 122 to the inductive element 108. The inductive element 108 (e.g., plasma generating coil) can be operable to generate an inductively coupled plasma 124 in the plasma processing chamber 102 when energized.

The conductive surface 110 can be disposed within the RF cage 104 proximate to at least a portion of the inductive element 108. The conductive surface 110 can be, for example, an RF shield. In some implementations, at least a portion of a peripheral edge of the conductive surface 110 can be retained in one or more grooves 126 located in a sidewall 128 of the RF cage 104. Additionally, and/or alternatively, at least a portion of the peripheral edge of the conductive surface 110 can be retained by one or more pins 130 disposed in a sidewall 128 of the RF cage 104.

The conductive surface 110 can be configured to separate the inductive element 108 (e.g., coil) from other elements (e.g., capacitors, etc.) in the RF cage 104. For example, the inductive element 108 can act as an antenna that electromagnetically couples (e.g., "communicates"), not only with the plasma 124, but with other components proximate to the inductive element 108. The conductive surface 110 can be configured to reduce undesirable electromagnetic coupling between the inductive element 108 and those other components, and replace such coupling with electromagnetic coupling between the conductive surface 110 and the indicative element 108. As indicated above, in some implementations, the conductive surface 110 can be grounded to reduce capacitive coupling that the indicative element 108 might have with the other components in the RF cage 104. Moreover, the conductive surface 110 can be arranged in such a way that the inductive element 108 is only slightly coupled (e.g., inductively) to the conductive surface 110 compared to a stronger coupling to the plasma 124. The power the conductive surface 110 takes from the inductive element 108 can be relatively small and the general effect of the conductive surface 110 on the plasma process can also be small.

Figure 2:
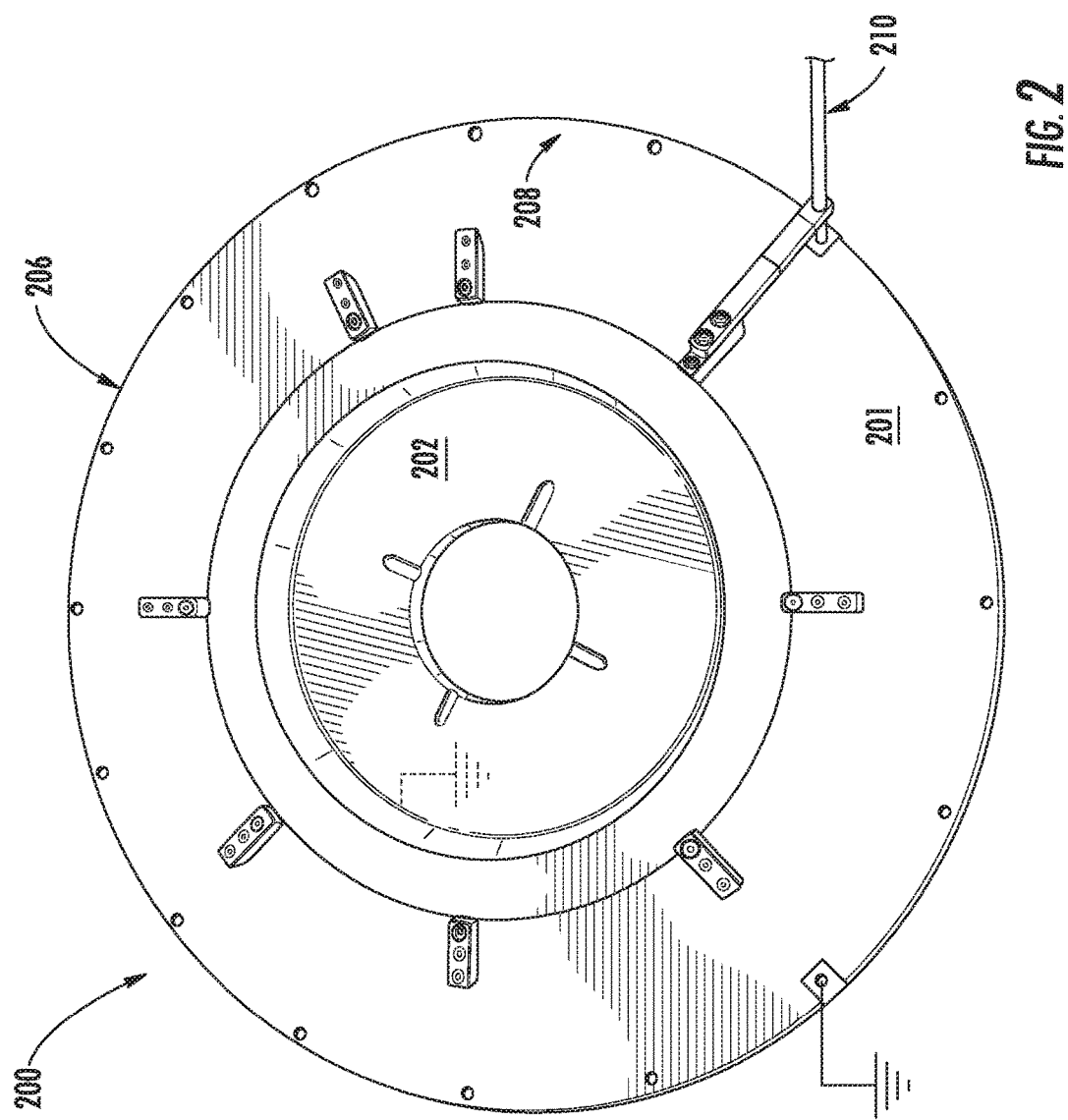
FIG. 2 depicts aspects of an example conductive surface according to example embodiments of the present disclosure.

The conductive surface 110 can be configured in various shapes and/or size(s). FIG. 2 depicts aspects of an example conductive surface 200 according to example embodiments of the present disclosure. In some implementations, the conductive surface 110 can have conductive shield 200. As shown, the conductive shield 200 can include an annular shield portion 201 and can be grounded. The conductive shield 200 can include a center portion 202 (e.g., of the annular shield portion 201) that can be configured to be fixed relative to at least a portion of the inductive element 108 (e.g., plasma generating coil) and a peripheral edge 206. As further described below, in some implementations conductive shield 200 can include a flexible section 208 incorporated as a portion of and/or attached to the annular shield 201. In this way, in addition to and/or instead of moving the peripheral edges 206 of the conductive surface 200, the flexible section 208 can slack down toward the inductive element 108, thereby creating an effect similar to bending down the conductive surface 200, as described herein.

At least a portion of the conductive shield 200 can be movable relative to the inductive element 108 (e.g., plasma generating coil). For example, at least a portion of the conductive shield 200 can be affixed to an adjustment mechanism 210 (e.g., arm and slot, telescoping mechanism). The adjustment mechanism 210 can be configured to tilt and/or bend at least a portion of the conductive shield 200 relative to the inductive element 108.

For instance, at least a portion of the peripheral edge 206 of the annular shield 201 can be movable towards and/or away from the inductive element 108. The adjustment mechanism 210 can be configured to cause at least the portion of the peripheral edge 206 to move towards and/or away from the inductive element 108. The adjustment mechanism 210 can be configured to be controlled by a controller (not shown). The controller can be configured to adjust the adjustment mechanism 210 (and the position of at least a portion of the conductive surface 110) based on input from a user and/or automatically, based, at least in part, on the process characteristics and/or the inductive coupling between the conductive surface 110 and the inductive element 108.

Figure 3:
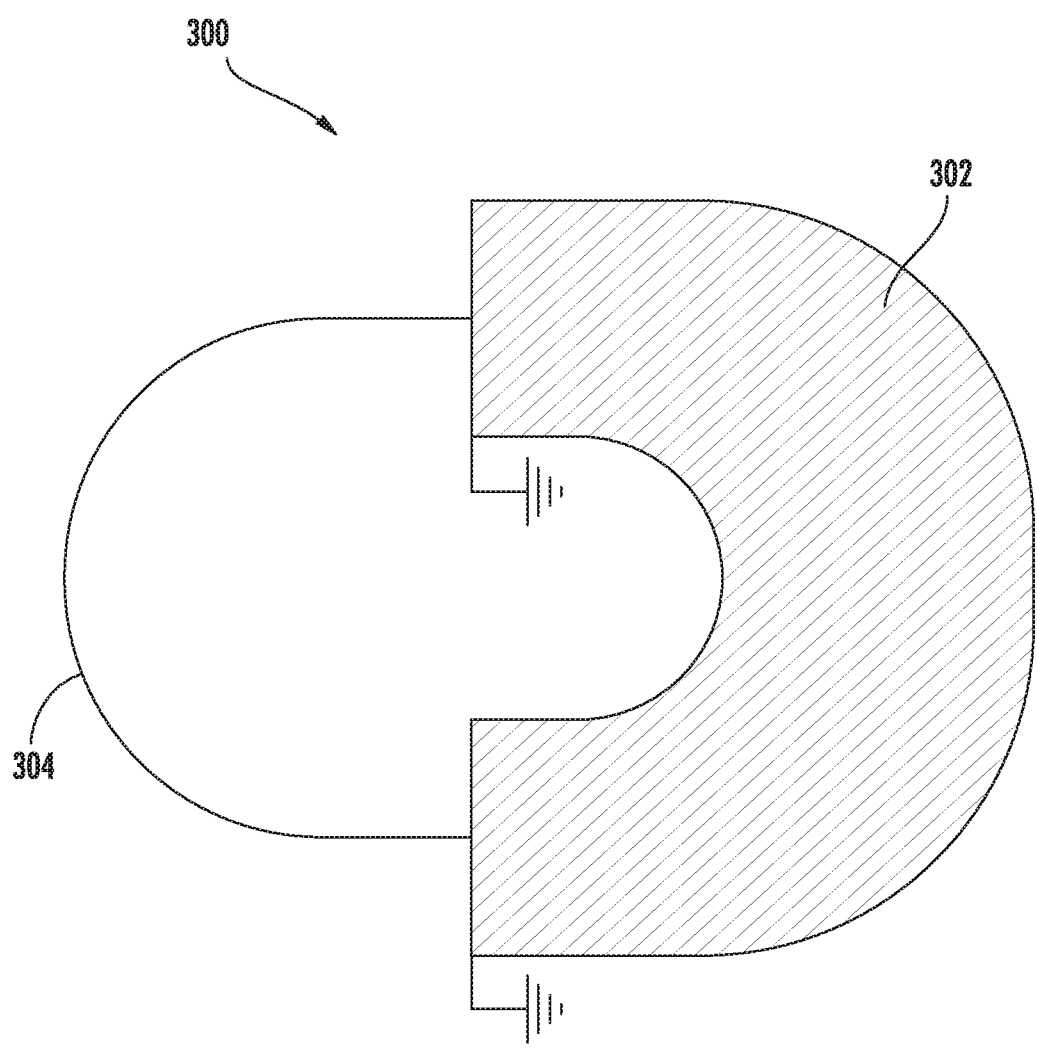
FIG. 3 depicts aspects of an example partial conductive surface according to example embodiments of the present disclosure.

The shape of conductive shield 200 is not intended to be limiting. The conductive surface 110 can include different shapes (e.g., square, rectangular, triangular, polygonal) than shown FIG. 2. Moreover, the conductive surface 110 can include irregular shapes. For instance, FIG. 3 depicts aspects of an example conductive surface 300 according to example embodiments of the present disclosure. The conductive surface 300 can include a partial annular shield 302. In some implementations, the partial annular shield 302 can be grounded and/or can include one or more wire(s) 304 that can be configured to close the loop of the partial annular shield 302, in order to create a current in the partial annular shield 302. In some implementations, the conductive surface 300 can be disposed proximate to only a select azimuthal portion of the inductive element 108 (e.g., plasma generating coil). In this way, partial shields disposed proximate to only a select azimuthal portion of the coil can be used to address more systematic azimuthal non-uniformities.

Returning to FIG. 1, the conductive surface 110 (e.g., which can include conductive shield 200, 300, etc.) can be disposed so as to generate an azimuthally variable inductive coupling between the conductive surface 110 and the inductive element 108 when the inductive element 108 is energized. The azimuthally variable inductive coupling between the conductive surface 110 and the inductive element 108 (e.g., plasma generating coil) can be operable to generate an asymmetric disturbance to an inductive coupling between the inductive element 108 and the inductively coupled plasma 124.

For instance, controlling the distance between different azimuthal portions of the inductive element 108 and the conductive surface 110 by tilting, bending, moving, etc. the conductive surface 110 can generate small asymmetric, disturbances to the coupling between the inductive element 108 and the plasma 124 (and to the plasma process which depends on the coupling). By way of example, at least a first azimuthal portion 132 of the conductive surface 110 can be bent, tilted, moved, etc. (e.g., via adjustment mechanism 210) closer to the inductive element 108 relative to a second azimuthal portion 134 of the conductive surface 110. The first azimuthal portion 132 of the conductive surface 110 can be located a first distance 136 from the inductive element 108 (e.g., plasma generating coil) and the second azimuthal portion 134 of the conductive surface 110 can be located a second distance 138 from the inductive element 108. The second distance 138 can be different from the first distance 136.

The adjustment of the first and second distances 136, 138 between different azimuthal portions of the conductive surface 110 and different azimuthal portions of the inductive element 108 can provide an effective control parameter for control of azimuthal process uniformity. For instance, bending or tilting the conductive surface 110 (e.g., first azimuthal portion 132) toward the inductive element 108 in a particular azimuthal area can reduce inductive element-to-plasma power transfer in that azimuthal area. Bending or tilting the conductive surface 110 (e.g., second azimuthal portion 134) away from the inductive element 108 in a particular azimuthal area can reduce inductive element-to-conductive surface coupling, and thus improve inductive element-to-plasma power transfer in that azimuthal area.

Since the power coupled to the conductive surface 110 can be small, the correction to the plasma process due to this action can also be small. For instance, when the first and/or second azimuthal portions 132, 134 of the conductive surface 110 gets closer to or farther from the inductive element 108, it can affect the current in the inductive element 108 elsewhere. In some implementations, it can have no azimuthal effect on the current in the inductive element 108. However, the current induced in the conductive surface 110 by the inductive element 108 can flow at different distances from the plasma 124, and can affect differently the field in the plasma 124. Accordingly, the effect generated in the plasma 124 can also be small, which makes it useful for control. Not bending or tilting the conductive surface 110 can generate a small, but uniform reduction of power transfer from the inductive element 108 to the plasma 124.

Figure 4:
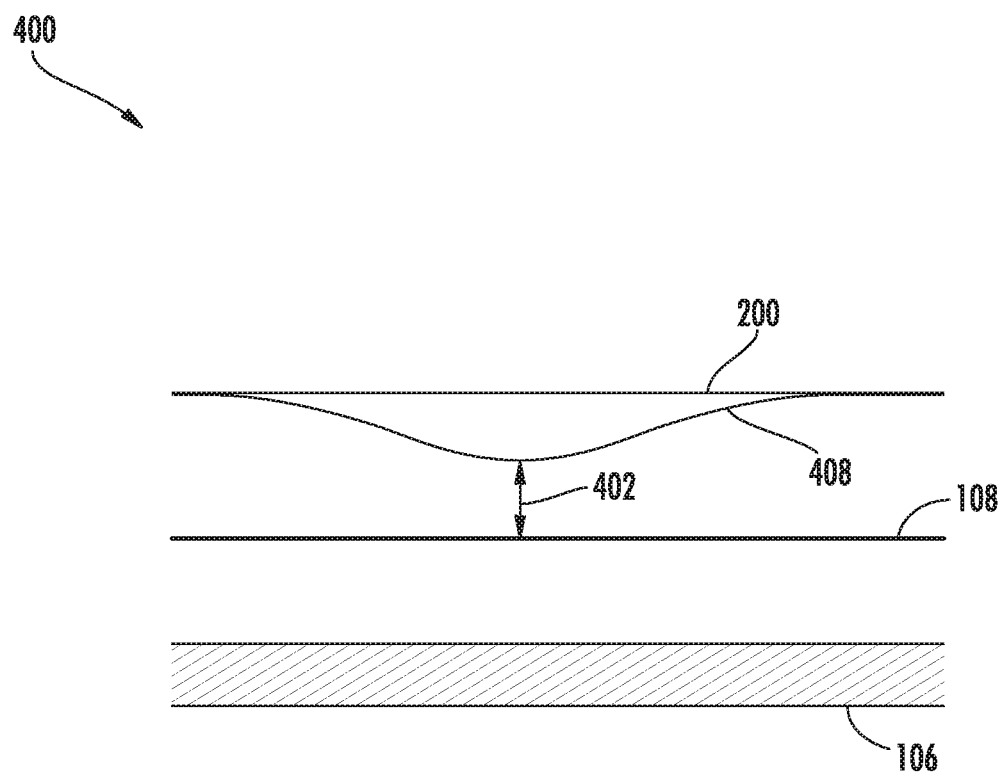
FIG. 4 depicts aspects of an example plasma processing apparatus that includes a conductive surface with one or more conductive wire(s) according to example embodiments of the present disclosure.

In some implementations, the plasma processing apparatus can include one or more conductive wire(s) that can be configured to create an effect similar to adjusting the conductive surface 110. FIG. 4 depicts aspects of an example plasma processing apparatus 400 that includes the conductive surface 200 with one or more conductive wire(s) 408. The conductive wire(s) 408 can be connected to the conductive surface 200. At least a portion of the conductive wire(s) 408 can be adjustable (e.g., via an adjustment mechanism not shown) to increase and/or decrease a distance 402 between the conductive wire(s) 408 and the inductive element 108 (e.g., plasma generating coil). In this way, in addition to and/or instead of moving the peripheral edges 206 of the conductive surface 200, the conductive wire(s) 408 can slack down toward the inductive element 108, thereby creating an effect similar to bending down the conductive surface 200, as described above.

Figure 5:
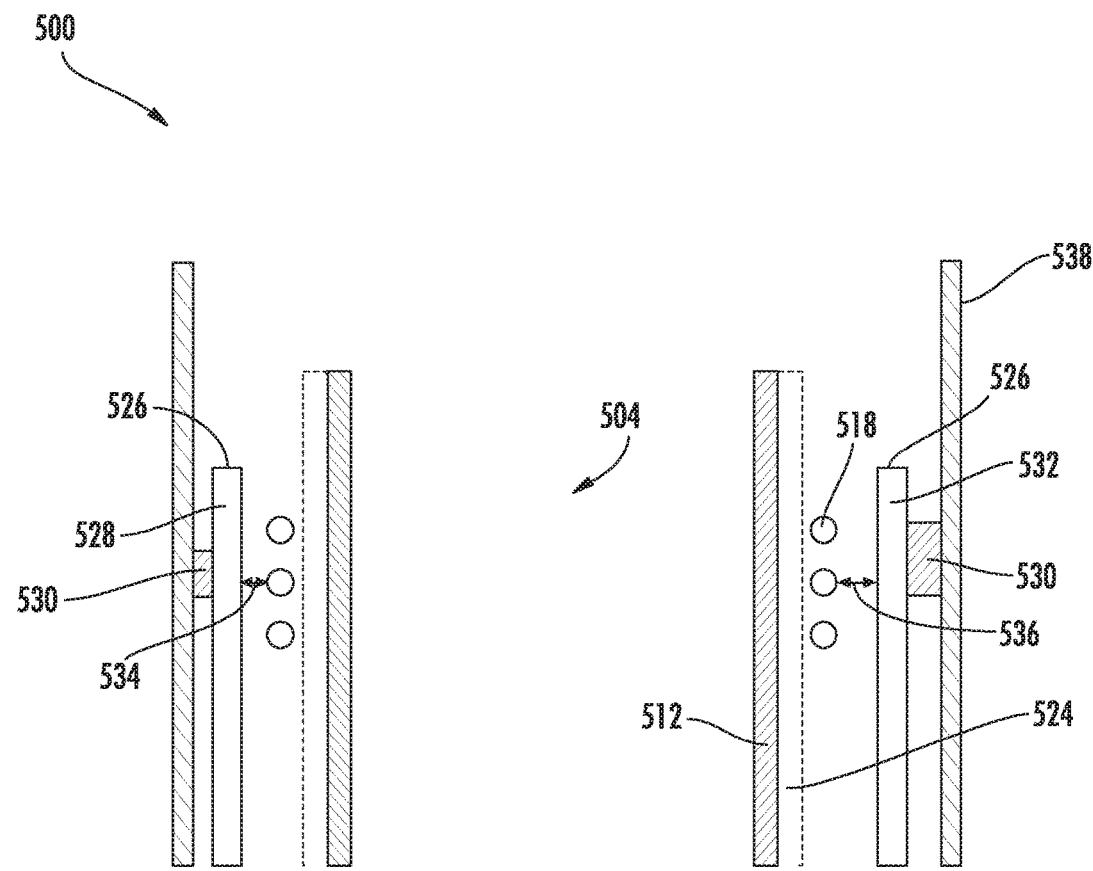
FIG. 5 depicts aspects of an example conductive element placement and operation with cylindrical plasma energizing coil according to the present disclosure.

FIG. 5 depicts aspects of example conductive element placement and operation with cylindrical plasma processing chamber 500 and cylindrical plasma energizing coil 518 according to example embodiments of the present disclosure. As illustrated, in this cross-sectional view, the plasma processing apparatus 500 can include a plasma chamber 504. An inductive plasma can be generated in plasma chamber 504 (i.e., plasma generation region).

The plasma chamber 504 can include a dielectric window 512. Dielectric window 512 can be formed from any dielectric material, such as quartz, ceramic, etc. An inductive element 518 (e.g., a plasma generating coil) can be disposed adjacent the dielectric window 512. The inductive element 518 can be coupled to an RF power generator through a suitable matching network (not shown). Reactant and carrier gases can be provided to the chamber interior from a gas supply (not shown). When the inductive element 518 is energized with RF power from the RF power generator, an inductive plasma can be induced in the plasma chamber 504. In some embodiments, the plasma reactor 500 can include a faraday shield 524 that can be configured to reduce capacitive coupling of the inductive element 518 to the plasma. The plasma chamber 504 can include a conductive surface 526 disposed proximate to at least a portion of the inductive element 518. The conductive surface 526 and the inductive element 518 disposed within an RF cage 538. The RF cage 538 can be configured to reduce the radiation of electromagnetic interference into the surrounding environment.

The conductive surface 526 can be configured to provide a similar effect as that described above with reference to the conductive surface 110 of FIG. 1. For instance, in some implementations, conductive surface 526 can be wrapped around the inductive element 518. By controlling the distance between different azimuthal portions of the inductive element 518 and the conductive surface 526, small asymmetric, disturbances to the coupling between the inductive element 518 and the plasma (and to the plasma process which depends on the coupling) can be generated. By way of example, at least a first azimuthal portion 528 of the conductive surface 526 can be bent, tilted, moved, etc. (e.g., via adjustment mechanism 530) closer to the inductive element 518 relative to a second azimuthal portion 532 of the conductive surface 526. The first azimuthal portion 528 can be located a first distance 534 from the inductive element 518 (e.g., plasma generating coil) and the second azimuthal portion 532 of the conductive surface 526 can be located a second distance 536 from the inductive element 518. The second distance 536 can be different from the first distance 534.

Figure 6:
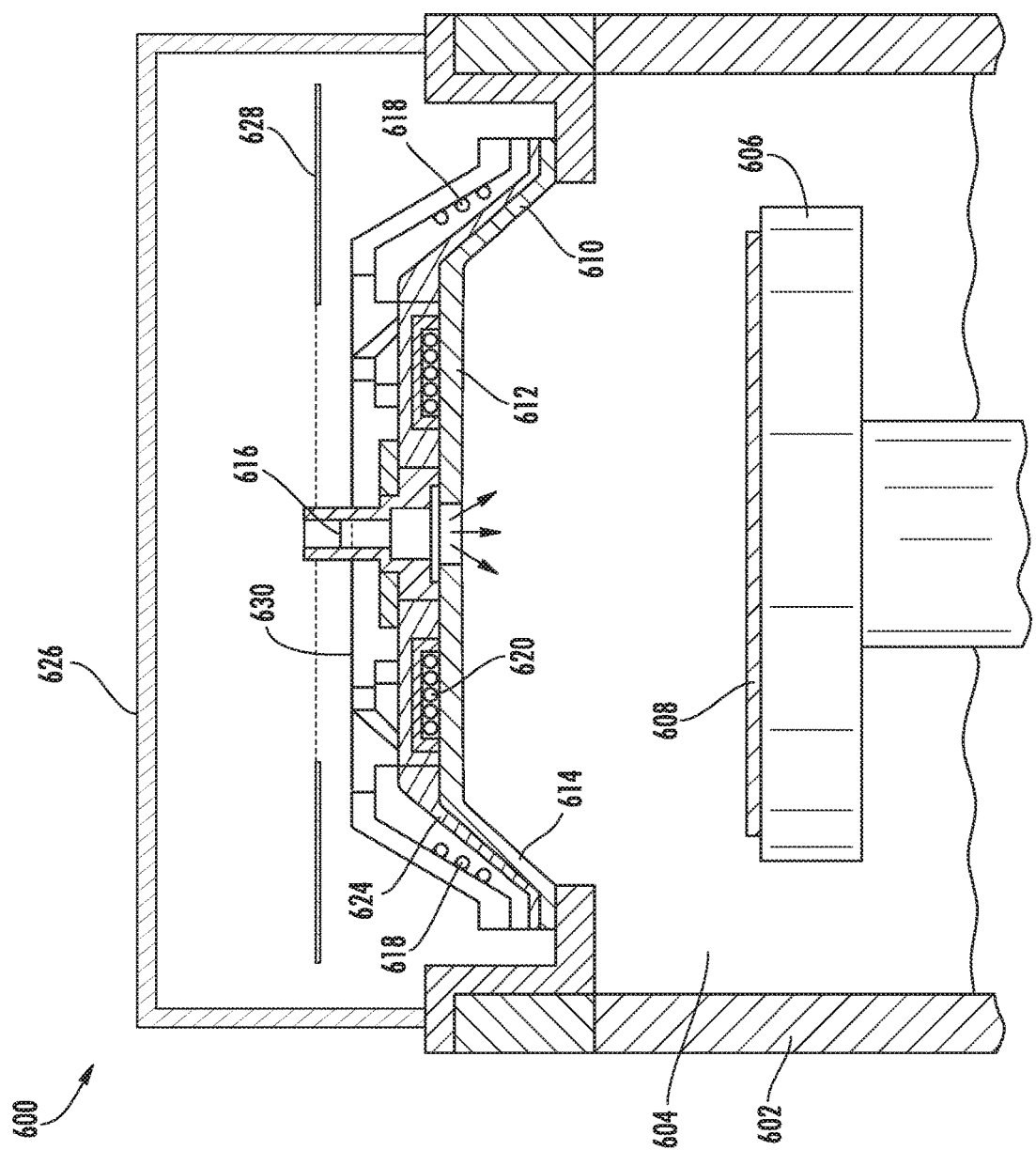
FIG. 6 depicts aspects of an example plasma processing apparatus according to example embodiments of the present disclosure.

FIG. 6 depicts a plasma processing apparatus 600 according to an example embodiment of the present disclosure. The plasma processing apparatus 600 can include a plasma processing chamber 602 defining an interior space 604. A pedestal or substrate holder 606 can be used to support a substrate 608 within the interior space 604. A dielectric window 610 can be located above the substrate holder 606. The dielectric window 610 can include a relatively flat central portion 612 and an angled peripheral portion 614. The dielectric window 610 can include a space in the central portion 612 for a showerhead 616 to feed process gas into the interior space 604.

The plasma processing apparatus 600 can include a plurality of inductive elements, such as a plurality of plasma generating coils. For instance, the plasma processing apparatus 600 can include a first inductive element 618 and a second inductive element 620, for generating an inductive plasma in the interior space 604 (operable to confine a process gas). The inductive elements 618, 620 can include a plasma generating coil and/or antenna element that when supplied with RF power, induces a plasma in the process gas in the interior space 604 of the plasma processing apparatus 600. For instance, a first RF generator (not shown) can be configured to provide electromagnetic energy through a matching network to the first inductive element 618. A second RF generator (not shown) can be configured to provide electromagnetic energy through a matching network to the second inductive element 620. The first inductive element 618 and/or the second inductive element 620 can be operable to generate an inductively coupled plasma in the plasma processing chamber 602 when energized with RF energy.

In some implementations, the plasma processing apparatus 600 can further include a Faraday shield 624 disposed between the first inductive element 618 and the dielectric window 612. Faraday shield 624 can be a slotted metal shield that reduces capacitive coupling between the first inductive element 618 and the interior space 604.

The plasma processing apparatus 600 can include an RF cage 626 disposed above the plasma processing chamber 602. The RF cage 626 can be formed by conductive material or by a mesh of such material. The RF cage 626 can be configured to reduce the radiation of electromagnetic interference into the surrounding environment.

The plasma processing apparatus 600 can include a plurality of conductive surfaces. The conductive surfaces can be disposed within the RF cage 626, proximate to at least a portion of the first and second inductive elements 618, 620. Each conductive surface can be associated with at least one of the plurality of inductive elements 618, 620. Additionally, and/or alternatively, each conductive surface can be so disposed as to generate an azimuthally variable inductive coupling between the conductive surface and its associated inductive element when the inductive element is energized.

For example, plasma processing apparatus can include a first conductive surface 628 and a second conductive surface 630. The first conductive surface 628 can be associated with the first inductive element 618. At least a portion of the first conductive surface 628 can be can be movable relative to the first inductive element 618 so as to generate a first azimuthally variable inductive coupling between the first conductive surface 628 and the first inductive element 618 when the first inductive element 618 is energized with RF energy. The second conductive surface 630 can be associated with the second inductive element 620. At least a portion of the second conductive surface 630 can be movable relative to the second inductive element 620 so as to generate a second azimuthally variable inductive coupling between the second conductive surface 630 and the second inductive element 620 when the second inductive element 620 is energized with RF energy. In this way, the first and second conductive surfaces 628, 630 can be configured to generate a similar effect to that described above with reference to conductive surface 110 of FIG. 1.

Figure 7:
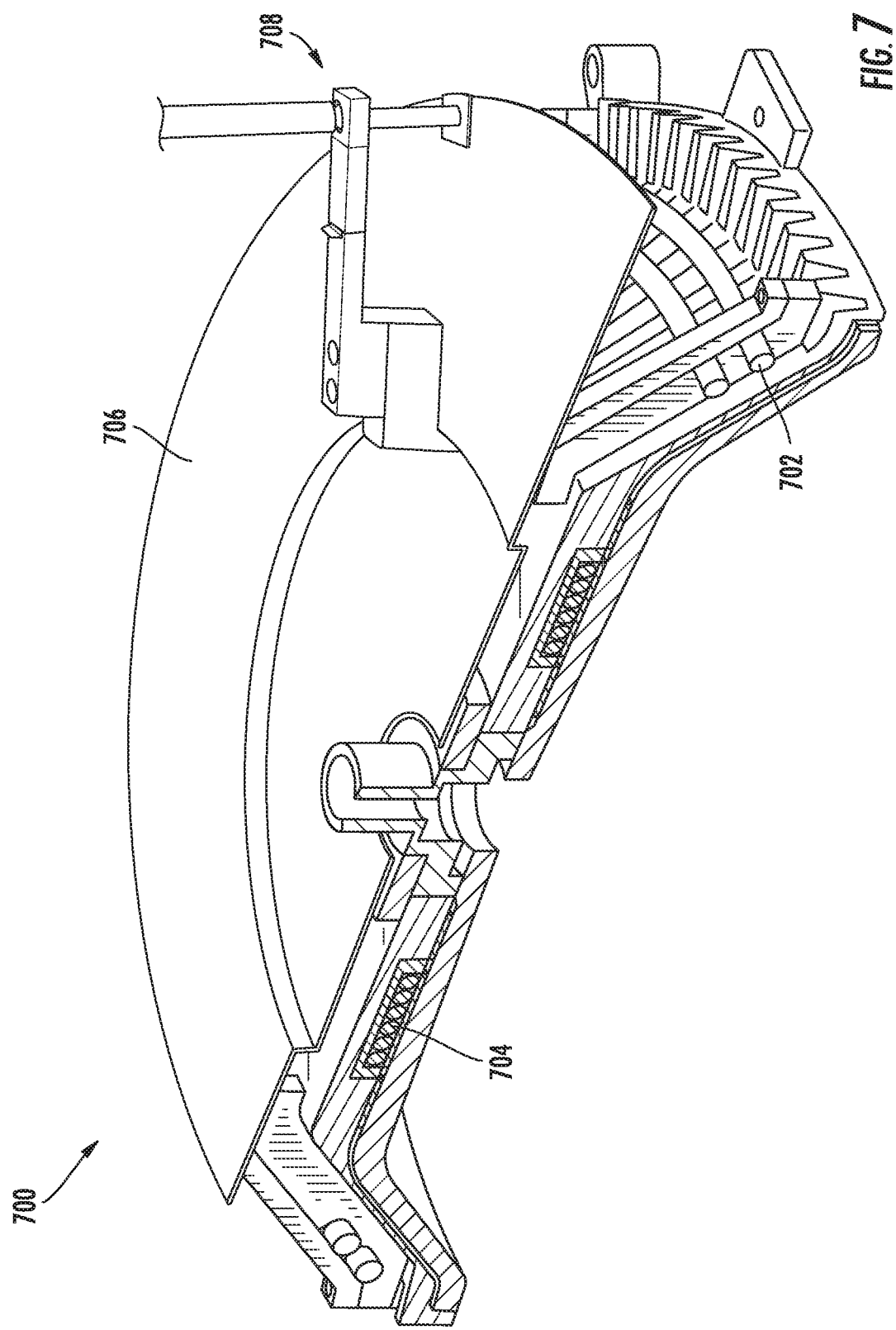
FIG. 7 depicts aspects of an example plasma processing apparatus according to example embodiments of the present disclosure.

In some implementations, a conductive surface can be associated with one or more inductive elements. For example, FIG. 7 depicts aspects of an example plasma processing apparatus 700 according to example embodiments of the present disclosure. As shown, the plasma processing apparatus 700 can include a first inductive element 702 and a second inductive element 704. A conductive surface 706 (e.g., annular shield) can be disposed proximate to at least a portion of the first inductive element 702. At least a portion of the conductive surface 706 can be movable (e.g., via adjustment mechanism 708) relative to the first inductive element 702. In this way, one or more azimuthally variable inductive couplings can be created between the conductive surface 706 and the first inductive element 702, when the first inductive element 702, is energized with RF energy. This process is similar to that described above with reference to FIG. 1.

Figure 8:
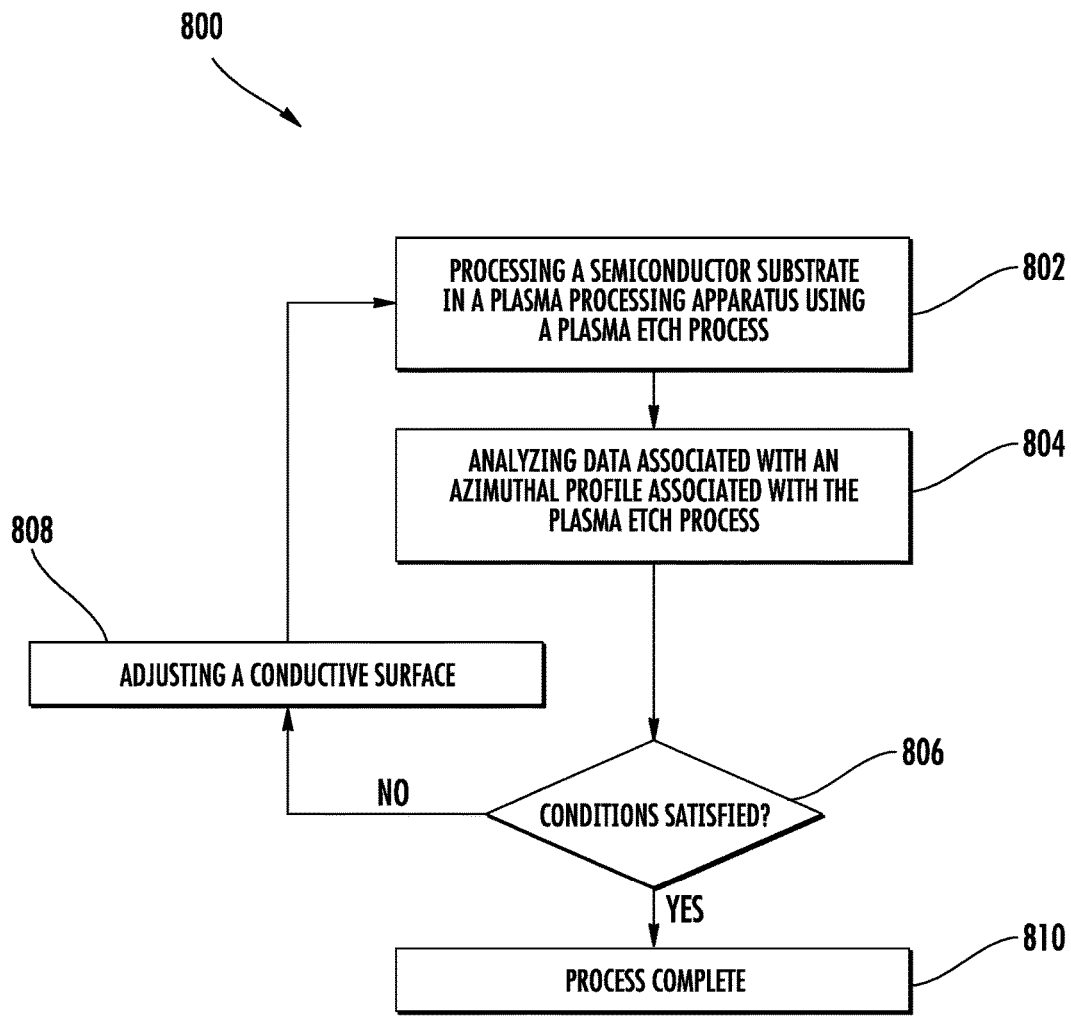
FIG. 8 depicts a flow diagram of an example method for adjusting azimuthal process uniformity in a plasma processing apparatus according to example embodiments of the present disclosure.

FIG. 8 depicts a flow diagram of an example method 800 for adjusting azimuthal process uniformity in a plasma processing apparatus according to example embodiments of the present disclosure. FIG. 8 can be implemented by a plasma processing apparatus and/or the control components and computing devices associated therewith. While method 800 is described below as being implemented by the plasma processing apparatus 100, method 800 can be implemented by any of the plasma processing apparatuses 100, 400, 500, 600, 700 described herein. In addition, FIG. 8 depicts steps performed in a particular order for purposes of illustration and discussion. Those of ordinary skill in the art, using the disclosures provided herein, will understand that the various steps of any of the methods disclosed herein can be modified, adapted, expanded, rearranged and/or omitted in various ways without deviating from the scope of the present disclosure.

At (802), the method 800 can include processing a semiconductor substrate 116 (e.g., wafer) in a plasma processing apparatus 100 using a plasma etch process. For example, the plasma processing apparatus 100 can include a plasma processing chamber 102, an RF cage 104 disposed above the plasma processing chamber 102, a dielectric window 106 separating the plasma processing chamber 102 and the RF cage 104, and an inductive element 108 (e.g., plasma generating coil) disposed above the dielectric window 106. When energized, the inductive element 108 can induce a plasma through interaction with a process gas (e.g., in the interior space 120) of plasma processing apparatus 100.

Figure 9:
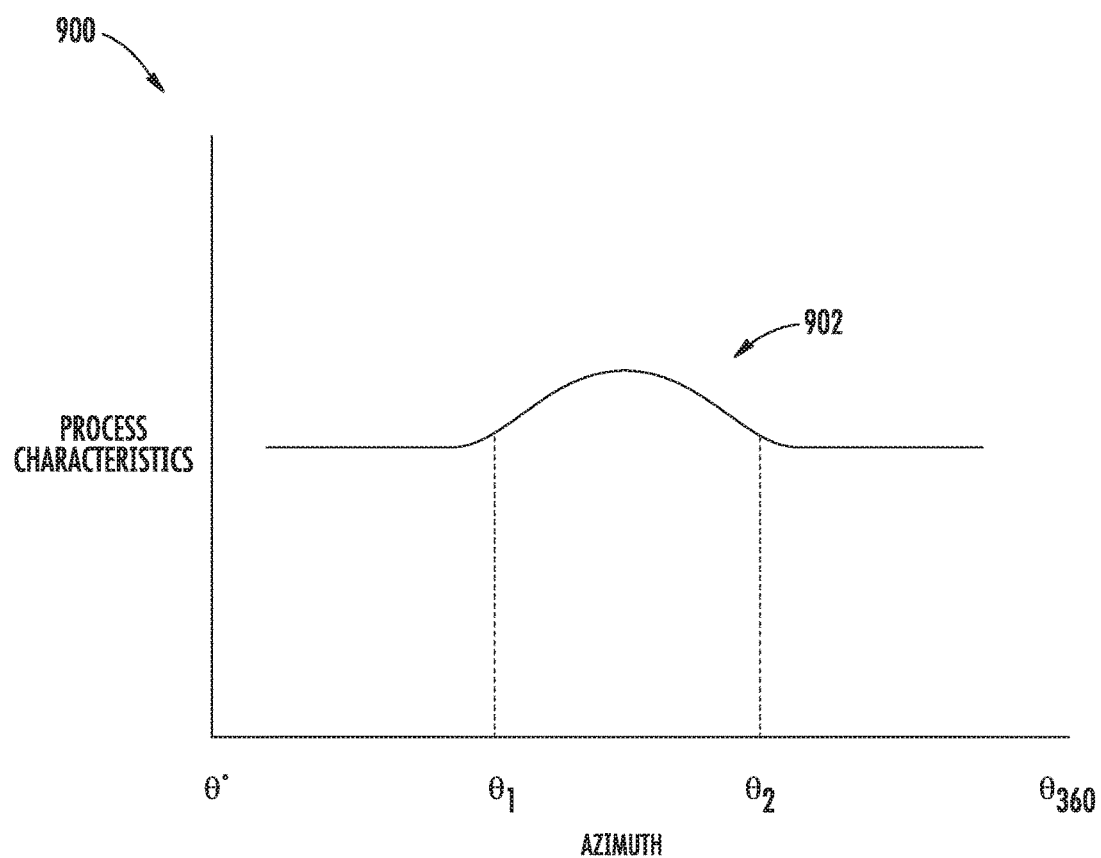
FIG. 9 depicts aspects of an example azimuthal profile according to example embodiments of the present disclosure.

At (804), the method 800 can include analyzing data associated with an azimuthal profile associated with a plasma etch process. For instance, FIG. 9 depicts aspects of an example azimuthal profile 900 at some radius according to example embodiments of the present disclosure. The azimuthal profile 900 can be indicative of the one or more process characteristic(s) (e.g., etch rate), relative to the azimuthal angle of a plasma etch process at some fixed radius. The azimuthal profile can include one or more minimums and/or maximums. The minimums and/or maximums can be identified near the edge of the plasma processing profile, where minimums and/or maximums can be more pronounced. For example, as shown in FIG. 9, the azimuthal profile 900 can include a maximum 902 between a first azimuth angle $\Theta_1$ and a second azimuth angle $\Theta_2$. The azimuthal profile 900 can be analyzed (manually and/or by a computing system) to identify, for example, a minimum and/or a maximum, such as the maximum 902 between the first azimuth angle $\Theta_1$ and the second azimuth angle $\Theta_2$.

At (806), the method 800 can include determining whether the conditions of the desired azimuthal profile are satisfied. For instance, a user and/or one or more computing device(s) associated with the plasma processing apparatus can determine whether the conditions of the desired azimuthal profile are satisfied based, at least in part, on the data associated with the azimuthal profile. When the conditions are not satisfied, the conductive surface can be adjusted at (808), as described below. When the conditions are satisfied, at (810) the method 800 can be completed. When the conditions are not satisfied, the method 800 can be repeated. In this way, the process can be implemented in one or more iteration(s) to achieve a desired uniformity/profile.

At (808), the method 800 can include adjusting a conductive surface. For instance, the method 800 can include adjusting the conductive surface 110 disposed within the RF cage 104 proximate to, at least a portion of, the inductive element 108 (e.g., plasma generating coil) to generate an azimuthally variable inductive coupling between the conductive surface 110 and the inductive element 108. The conductive surface 110 can be adjusted based, at least in part, on one or more minimums or maximums identified in the data associated with the plasma etch process.

For instance, the distance of the conductive surface 110 relative to the inductive element 108 can be adjusted to change the azimuthal profile of the process. For instance, a peripheral edge of the conductive surface 110 can be moved closer to the inductive element 108 at azimuthal locations between azimuth $\theta_1$ and $\theta_2$ where ICP power to plasma needs to be decreased. Additionally, and/or alternatively, a peripheral edge of the conductive surface 110 can be lifted up (moved away) from the inductive element 108 at azimuthal locations outside azimuths $\theta_1$ and $\theta_2$ where ICP power to plasma needs to be increased.

For example, the conductive surface 110 can be adjusted based, at least in part, on the maximum 902 identified in the azimuthal profile 900. Adjusting the conductive surface 110 can include moving the first azimuthal portion 132 of a peripheral edge of the conductive surface 110 (e.g., peripheral edge 206 of conductive surface 200) closer to the inductive element 108 (e.g., plasma generating coil) relative to the second azimuthal portion 134 of the peripheral edge of the conductive surface 110. The first azimuthal portion 132 of a peripheral edge of the conductive surface 110 can be moved farther away from the inductive element 108 relative to the second azimuthal portion 134 of the peripheral edge of the conductive surface 110. Such adjustment can induce an effect, as described above with reference to FIG. 1.

In some implementations, one or more flexible section(s) and/or conductive wire(s) of the conductive surface can be adjusted based, at least in part, on one or more minimums or maximums identified in the data associated with the plasma etch process. For example, to address the maximum 902 identified in azimuthal profile 900, at least a portion of the conductive wire(s) 408 (and/or the flexible section 208) can be adjusted (e.g., via an adjustment mechanism) to increase and/or decrease the distance 402 between the conductive wire(s) 408 (and/or the flexible section 208) and the inductive element 108. In this way, in addition to and/or instead of moving the peripheral edges of the conductive surface 110, the conductive wire(s) 408 (and/or the flexible section 208) can move relative to the inductive element 108, thereby creating a similar effect. In some implementations, (802) to (806) can be repeated in an attempt to achieve a desired uniformity and/or azimuthal profile.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A plasma processing apparatus, comprising:
   a plasma processing chamber;
   an RF cage disposed above the plasma processing chamber;
   a dielectric window separating the plasma processing chamber and the RF cage;
   a plasma generating coil disposed above the dielectric window, the plasma generating coil operable to generate an inductively coupled plasma in the plasma processing chamber when energized; and
   a conductive surface disposed within the RF cage above at least a portion of the plasma generating coil, wherein the conductive surface is an RF shield configured to reduce communication between the plasma generating coil and at least one other element in the RF cage;
   wherein both the RF cage and the conductive surface are grounded, and
   wherein the conductive surface is inclined such that a first peripheral edge of a lower surface facing towards the plasma generating coil located at a first azimuthal portion of the conductive surface is located a first vertical distance above the plasma generating coil, and a second peripheral edge of the lower surface located at a second azimuthal portion of the conductive surface is located a second vertical distance above the plasma generating coil, the second vertical distance being different from the first vertical distance to provide an asymmetric azimuthal profile so as to generate an azimuthally variable inductive coupling between the conductive surface and the plasma generating coil when the plasma generating coil is energized.

2. The plasma processing apparatus of claim 1, wherein the azimuthally variable inductive coupling between the conductive surface and the plasma generating coil provides an asymmetric disturbance to an inductive coupling between the plasma generating coil and the inductively coupled plasma.

3. The plasma processing apparatus of claim 1, wherein at least a portion of the conductive surface is movable relative to the plasma generating coil.

4. The plasma processing apparatus of claim 1, wherein the conductive surface comprises an annular shield.

5. The plasma processing apparatus of claim 4, wherein at least a first azimuthal portion of the annular shield is bent closer to the plasma generating coil relative to a second azimuthal portion of the annular shield.

6. The plasma processing apparatus of claim 4, wherein a center portion of the annular shield is fixed relative to the plasma generating coil.

7. The plasma processing apparatus of claim 4, wherein at least a portion of the first or the second peripheral edge of the annular shield is movable towards and away from the plasma generating coil.

8. The plasma processing apparatus of claim 7, where the at least a portion of the first or the second peripheral edge is retained by one or more pins disposed in a sidewall of the RF cage.

9. The plasma processing apparatus of claim 1, wherein the apparatus comprises a plurality of plasma generating coils.

10. The plasma processing apparatus of claim 9, wherein the apparatus comprises a plurality of conductive surfaces, each conductive surface associated with at least one of the plurality of plasma generating coils, each conductive surface so disposed as to generate an azimuthally variable inductive coupling between the conductive surface and its associated plasma generating coil when the plasma generating coil is energized.

11. The plasma processing apparatus of claim 1, further comprising a conductive wire connected to the conductive surface, at least a portion of the conductive wire being adjustable to increase or decrease a distance between the conductive wire and the plasma generating coil.

12. The plasma processing apparatus of claim 1, wherein the conductive surface is coupled to the RF cage.

13. The plasma processing apparatus of claim 12, wherein the conductive surface is coupled to the RF cage via one or more grooves defined by the RF cage.

* * * * *